United States Patent
Jang

(10) Patent No.: US 7,632,743 B2
(45) Date of Patent: Dec. 15, 2009

(54) METHOD OF MANUFACTURING FLASH MEMORY DEVICE

(75) Inventor: Min Sik Jang, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 135 days.

(21) Appl. No.: 11/479,332

(22) Filed: Jun. 30, 2006

(65) Prior Publication Data
US 2007/0148865 A1    Jun. 28, 2007

(30) Foreign Application Priority Data
Dec. 23, 2005    (KR) .................. 10-2005-0128757

(51) Int. Cl.
H01L 21/44    (2006.01)

(52) U.S. Cl. ............... 438/583; 438/201; 438/211; 438/257; 257/E21.296

(58) Field of Classification Search .......... 438/594, 438/583
See application file for complete search history.

(56) References Cited

U.S. PATENT DOCUMENTS

| | | | | |
|---|---|---|---|---|
| 4,640,004 | A | * | 2/1987 | Thomas et al. ............ 438/632 |
| 4,816,425 | A | * | 3/1989 | McPherson ............... 438/592 |
| 6,350,684 | B1 | * | 2/2002 | Wang et al. .............. 438/655 |
| 6,380,029 | B1 | * | 4/2002 | Chang et al. ............. 438/257 |
| 6,726,955 | B1 |  | 4/2004 | Wang et al. |
| 7,442,606 | B2 | * | 10/2008 | Lee ..................... 438/257 |
| 2001/0051428 | A1 | * | 12/2001 | Liu ..................... 438/683 |
| 2003/0119255 | A1 |  | 6/2003 | Dong et al. |
| 2004/0106281 | A1 |  | 6/2004 | Tu et al. |
| 2004/0121569 | A1 | * | 6/2004 | Storbeck et al. .......... 438/585 |
| 2006/0205159 | A1 | * | 9/2006 | Park .................... 438/265 |

FOREIGN PATENT DOCUMENTS

| | | |
|---|---|---|
| CN | 1087446 | 6/1994 |
| CN | 1134602 | 10/1996 |
| CN | 1222754 | 7/1999 |
| WO | WO 0182350 | * 11/2001 |

OTHER PUBLICATIONS d'Heurle et al. (d'Heurle, F. "Oxidation of silicide thin films: TiSi2" Appl. Phys. Letters vol. 42 Issue 4 pp. 361-363 Feb. 15, 1983.*
Samsonov et al. (Samsonov, G.V. "Oxidation of tungsten disilicide in oxygen" Powder Metallurgy and Metal Ceramics vol. 13 Num 3 pp. 232-235 published online Dec. 13, 2004 first published Mar. 1974.*

* cited by examiner

Primary Examiner—Evan Pert
Assistant Examiner—Grant S Withers
(74) Attorney, Agent, or Firm—Townsend and Townsend and Crew LLP

(57) ABSTRACT

A method of manufacturing a flash memory device includes forming a first polysilicon layer over a semiconductor substrate to form a floating gate. A tunnel dielectric layer is formed over the first polysilicon layer. A second polysilicon layer and a tungsten silicide layer are formed over the tunnel dielectric film to firm a control gate, the tungsten silicide layer having excess silicon. An upper portion of the tungsten silicide layer is oxidized to move the excess silicon away from an interface between the second polysilicon layer and the tungsten silicide.

19 Claims, 1 Drawing Sheet

METHOD OF MANUFACTURING FLASH MEMORY DEVICE

BACKGROUND

The present invention relates to a method of manufacturing a semiconductor memory device, and more particularly, to a method of manufacturing a flash memory device which can improve the interfacial characteristics between a tungsten silicide layer and a polysilicon layer while reducing the resistance of the tungsten silicide layer.

Existing NOR flash memory has inherent limits to program speed. To overcome the limits, NAND flash memory devices have been proposed which can perform a data program by injecting electrons into the floating gate by Fowler-Nordheim (FN) tunneling and can provide large capacity and high integration.

A NAND flash memory device includes a plurality of cell blocks. Each cell block includes a plurality of cell strings, which contains a plurality of cells. The cells are connected in series to form a string. A drain select transistor is formed between the cell string and drain, and a source select transistor is formed between the cell string and source.

The cell of the NAND flash memory device is formed by forming an isolation structure on a given region of a semiconductor substrate, forming a gate in which a tunnel oxide film, a floating gate, a dielectric layer, and a control gate are laminated on a given region on the semiconductor substrate, and forming junction regions at both sides of the gate. The floating gate is formed using a polysilicon layer, and the control gate is formed using the polysilicon layer and the tungsten silicide layer.

As the level of integration of semiconductor devices is increased and the line width decreases, line the resistance can increase significantly. Accordingly, tungsten electrodes, which have a lower resistance than the tungsten silicide, have been developed. However, use of the tungsten electrodes presents difficulties subsequent processes. Also, tungsten tends to oxidize which results in increased resistance.

On the other hand, to reduce resistance in tungsten silicide, an additional high temperature thermal process needs to be applied after deposition. This method is also difficult to apply consistently to future devices.

In addition, if the high temperature thermal process is performed in order to reduce the resistance, the interfacial characteristics between the tungsten silicide and polysilicon (i.e., primary electrode) becomes very poor. This results from an increased grain size as the amorphous tungsten silicide is crystallized by the thermal process.

Furthermore, the tungsten silicide layer is formed in a state where the ratio of tungsten to silicon is 1:2.3 to 1:2.6. However, the ratio doubles from the thermal process and the excess silicon is moved toward the interface between polysilicon and tungsten silicide, resulting in further degradation of the interfacial characteristics. For this reason, when lines are patterned by etching the gates, failures can occur. Therefore, annealing is carried out after the gates are patterned.

However, if annealing is performed after the gates are patterned, a hard mask film is deposited on the tungsten silicide and there is a high possibility that fluorine within the tungsten silicide may diffuse into the gate dielectric layer. This causes the electrical characteristic of the gate dielectric layer to be degraded.

SUMMARY OF THE INVENTION

An embodiment of the present invention provides a method of manufacturing a flash memory device, in which the interfacial characteristics between a tungsten silicide layer and a polysilicon layer can be improved while reducing the resistance of the tungsten silicide layer.

According to the present invention, after a tungsten silicide layer is deposited, wet, dry or radical oxidization processes are performed at high temperatures. Excess silicon within the tungsten silicide layer is induced to the top surface of the tungsten silicide layer, away from the polysilicon layer, and then oxidized to reduce the silicon gathering along the interface between the polysilicon layer and the tungsten silicide layer. It is therefore possible to improve the interfacial characteristics and to reduce the resistance of tungsten silicide by high-temperature annealing.

Furthermore, since the excess silicon is removed through oxidization, the tungsten to silicon ratio within the tungsten silicide layer can be increased and resistance reduced without performing an annealing process under a nitrogen atmosphere.

Since the excess silicon is removed, the thickness of the tungsten silicide layer is increased by at least the thickness of the excess silicon removed. The interfacial characteristic between polysilicon and the tungsten silicide layer is improved.

In addition, annealing can be performed shortly after the tungsten silicide layer is deposited. Annealing at this time provides a higher probability that fluorine within the tungsten silicide layer will exit externally and not into the dielectric layer. It is therefore possible to prevent the thermal conductive film from being degraded due to fluorine.

According to an embodiment of the present invention, there is provided a method of manufacturing a flash memory device, including the steps of; forming a tunnel oxide film and a first polysilicon layer on a semiconductor substrate and patterning the tunnel oxide film and the first polysilicon layer; forming a dielectric layer, a second polysilicon layer, and a tungsten silicide layer on the entire structure; performing an oxidization process to move excessive silicon within the tungsten silicide layer to the top surface of the tungsten silicide layer and then forming an oxide film through oxidization and stripping the oxide film.

According to one embodiment, a method of manufacturing a flash memory device includes forming a first polysilicon layer over a semiconductor substrate to form a floating gate; forming a tunnel dielectric layer over the first polysilicon layer; forming a second polysilicon layer and a tungsten silicide layer over the tunnel dielectric film to firm a control gate, the tungsten silicide layer having excess silicon; and oxidizing an upper portion of the tungsten silicide layer to move the excess silicon away from an interface between the second polysilicon layer and the tungsten silicide. The method further includes patterning the tunnel dielectric layer and the first polysilicon layer prior to forming the second polysilicon layer. The method further includes removing an oxide layer formed on the upper portion of the tungsten silicide by the oxidizing step.

According to another embodiment, a method of manufacturing a flash memory device includes forming a first polysilicon layer over a semiconductor substrate to form a floating gate; forming a tunnel dielectric layer over the first polysilicon layer; patterning the tunnel oxide film and the first polysilicon layer; forming a second polysilicon layer and a silicide layer over the patterned tunnel dielectric film to firm a control gate, the silicide layer having excess silicon; oxidizing an upper portion of the silicide layer to move the excess silicon away from an interface between the second polysilicon layer and the silicide; and removing an oxide film formed at the upper portion of the silicide as a result of the oxidizing step.

The silicide is tungsten silicide or aluminum silicide, or the like. The silicide layer is formed by forming a first silicide film having a first silicon ratio and a second silicide film having a second silicon ratio over the first silicide film, the second silicon ratio being higher than the first silicon ratio.

In yet another embodiment, a method of manufacturing a flash memory device includes forming a first polysilicon layer over a semiconductor substrate to form a floating gate. A tunnel dielectric layer is formed over the first polysilicon layer. A second polysilicon layer and a tungsten silicide layer are formed over the tunnel dielectric film to firm a control gate, the tungsten silicide layer having excess silicon. An upper portion of the tungsten silicide layer is oxidized to move the excess silicon away from an interface between the second polysilicon layer and the tungsten silicide.

DETAILED DESCRIPTION OF EMBODIMENTS

The present invention will be described in detail in connection with certain embodiments with reference to the accompanying drawings.

Figure 1A:
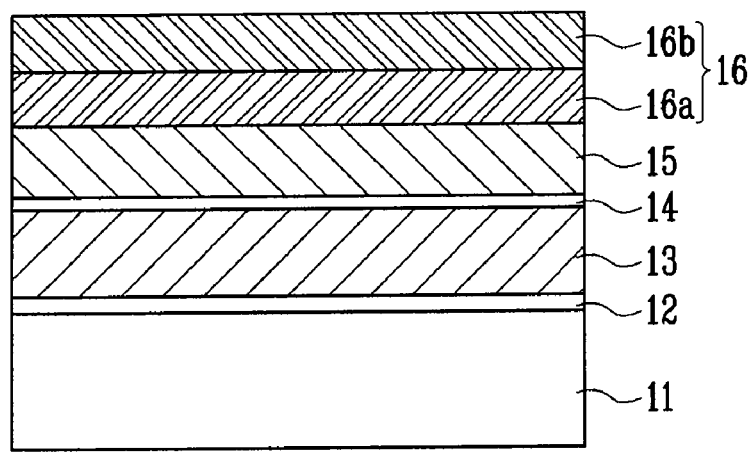
FIGS. 1A to FIG. 1C are cross-sectional views illustrating a method of manufacturing a flash memory device according to an embodiment of the present invention.

Referring to FIG. 1A, a tunnel oxide film 12 and a first polysilicon layer 13 are sequentially formed on a semiconductor substrate 11 and then patterned. The first polysilicon layer 13 will serve as a floating gate subsequently. The first polysilicon layer 13 may be formed using a Shallow Trench Isolation (STI) method after an isolation structure is formed. Alternatively, the first polysilicon layer 13 may be formed using a Self-Aligned Shallow Trench Isolation (SA-STI) method. When using the SA_STI method the isolation structure is formed by patterning the tunnel oxide film 12 and the first polysilicon layer 13 are patterned at the same time, and another polysilicon layer is formed on the first polysilicon layer 13. Furthermore, the first polysilicon layer 13 may be defined between the isolation structure by means of a Self-Aligned Floating Gate (SAFG) method.

A dielectric layer 14 is formed on the first polysilicon layer 13. Then a second polysilicon layer 15 and a tungsten silicide layer 16 are formed on the dielectric layer 14. The tungsten silicide layer 16 may be formed by a LPCVD method using silane ($SiH_4$) or DCS ($SiH_2Cl_2$) and $WF_6$ as source gases. The ratio of tungsten to silicon in the tungsten silicide layer 16 ranges from 1:2.2 to 1:2.8 in the present implementation. Furthermore, if silane ($SiH_4$) and $WF_6$ are used as the source gases, the tungsten silicide layer 16 may be formed at a temperature of 350 to 500° C. If DCS ($SiH_2Cl_2$) and $WF_6$ are used as the source gases, the tungsten silicide layer 16 may be formed at a temperature of 500 to 600° C.

Furthermore, to improve the interfacial characteristic between the second polysilicon layer 15 and the tungsten silicide layer 16, the composition of the tungsten silicide layer 16 may include two layers or more. For example, a first tungsten silicide layer 16a having a relatively high tungsten to silicon ratio is formed on the second polysilicon layer 15, and then a second tungsten silicide layer 16b having a relatively low tungsten to silicon ratio may be deposited over the first layer, keeping the second layer having a higher concentration of silicon away from the second polysilicon layer 15. The interfacial characteristics will be further improved during the oxidization process described below. The tungsten silicide layer 16 may be formed by a sputtering method.

Figure 1B:
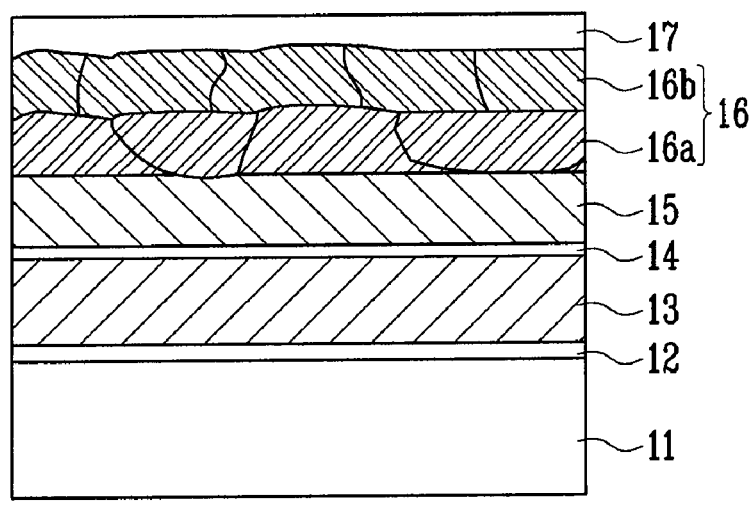

Referring to FIG. 1B, after the tungsten silicide layer 16 is formed; a wet, dry or radical oxidization process is performed. The wet oxidization process may be performed through selective oxidization at a temperature of 700 to 1000° C. (or 700 to 900° C.) under $H_2O/H_2$ atmosphere. Selective oxidization prevents the oxidization of tungsten within the tungsten silicide layer 16.

After the selective wet oxidization process is performed at a temperature of 700 to 900° C., the temperature may be raised to 1000 to 1200° C. for additional annealing under a nitrogen-based or argon-based gas atmosphere. This second annealing step is performed to reduce the resistance by further growing the grains of the tungsten silicide layer 16.

For the case of dry oxidization, the dry oxidization process may be performed at a temperature of 700 to 1200° C. under an $O_2$ gas atmosphere. The oxidization rate can be slowed by introducing a nitrogen-based gas or an argon-based gas. The radical oxidization process is carried out using $H_2/O_2$ gas at a temperature of 700 to 1200° C.

If the oxidization process is performed after the tungsten silicide layer 16 is formed, the excess silicon within the tungsten silicide layer 16 moves to the top surface (or upper portion) of the tungsten silicide layer 16 and then oxidized. An oxide film 17 is formed as a result of the oxidation process. The total thickness of the second polysilicon layer 15 and the tungsten silicide layer 16 is reduced, thereby effecting the the thickness of the tungsten silicide layer 16.

In other words, in the case where the tungsten silicide layer 16 having the same thickness is applied, the total thickness of the control gate is reduced and interfacial charges between gate lines can be reduced. By increasing the thickness of the tungsten silicide layer 16, the resistance can be reduced additionally.

Figure 1C:
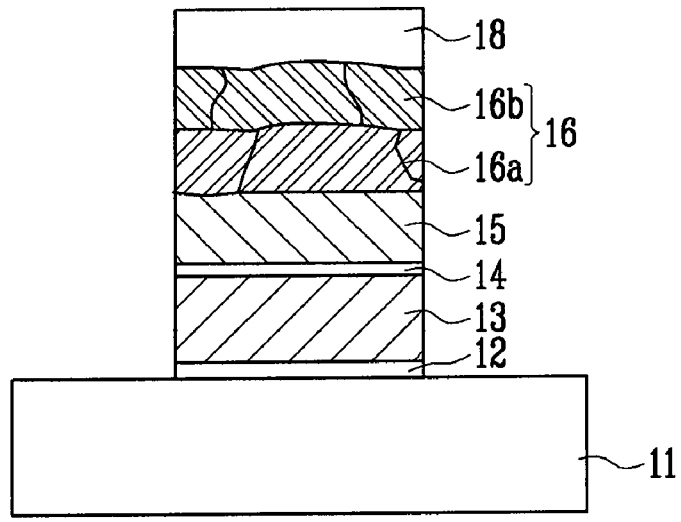

Referring to FIG. 1C, the oxide film 17 is stripped (or removed) using HF, BOE or the like. Thereafter, a given region from the tungsten silicide layer 16 to the tunnel oxide film 12 is etched using a photo and etch process and employing a control gate mask 18, thereby forming a gate electrode in which the floating gate and the control gate are laminated.

As described above, according to the present invention, after the tungsten silicide layer is formed, the wet, dry or radical oxidization process is performed to remove the excess silicon. Accordingly, the interfacial characteristic between the tungsten silicide layer and the polysilicon layer can be improved while reducing the resistance of the tungsten silicide layer. It is therefore possible to prevent failures when etching the gate.

Furthermore, since interfacial charges between the gate lines can be reduced, the electrical characteristic of devices can be improved. Since annealing is carried out right after the tungsten silicide layer is deposited, there is a high probability that fluorine within the tungsten silicide layer will exit externally and not into the dielectric layer. It is therefore possible to prevent the degradation of the dielectric layer due to fluorine. Furthermore, the invention can be implemented using existing processes and equipment to reduce development time and cost.

While the invention has been described in connection with what is presently considered to be specific embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a flash memory device, the method comprising:
    forming a first polysilicon layer over a semiconductor substrate to form a floating gate;
    forming a dielectric layer over the first polysilicon layer;
    forming a second polysilicon layer and a tungsten silicide layer over the dielectric film to form a control gate;
    forming an oxide film on a surface of the tungsten silicide layer by oxidizing silicon within the tungsten silicide layer before an etch process of the tungsten silicide layer is performed to form a control gate; and
    completely removing the oxide film formed on the surface of the tungsten silicide layer to expose a top surface of the tungsten silicide layer.

2. The method of claim 1, further comprising:
    patterning the first polysilicon layer prior to forming the dielectric layer.

3. The method as claimed in claim 1, wherein the tungsten silicide layer is formed by a LPCVD method using silane ($SiH_4$) or DCS ($SiH_2Cl_2$) and $WF_6$ as source gases.

4. The method as claimed in claim 1, wherein the tungsten silicide layer is formed in a state where the ratio of tungsten and silicon is set to range from 1:2.2 to 1:2.8.

5. The method as claimed in claim 1, wherein the tungsten silicide layer is formed using silane ($SiH_4$) and $WF_6$ as source gases at a temperature of 350 to 500° C.

6. The method as claimed in claim 1, wherein the tungsten silicide layer is formed using DCS ($SiH_2Cl_2$) and $WF_6$ as source gases at a temperature of 500 to 600° C.

7. The method as claimed in claim 1, wherein the tungsten silicide layer is formed by depositing a first tungsten silicide film having a high tungsten ratio and then depositing a second tungsten silicide film having a low tungsten ratio.

8. The method as claimed in claim 1, wherein the tungsten silicide layer is formed by a sputtering method.

9. The method as claimed in claim 1, wherein the step of forming the oxide film includes a selective oxidization process performed at a temperature of 700 to 1000° C. under an $H_2O/H_2$ atmosphere to prevent the oxidization of tungsten within the tungsten silicide layer.

10. The method as claimed in claim 9, wherein the step of forming the oxide film includes performing a wet oxidization process performed at a temperature of 700 to 900° C., the method further comprising:
    raising the temperature to 1000 to 1200° C. after the wet oxidization process to perform a thermal treatment process under nitrogen-based gas or argon-based gas atmosphere.

11. The method as claimed in claim 1, wherein the step of forming the oxide is performed at a temperature of 700 to 1200° C. under an $O_2$ gas atmosphere.

12. The method as claimed in claim 11, wherein the step of forming the oxide film involves a dry oxidization process, the dry oxidization process includes introducing a nitrogen-based gas or an argon-based gas in order to slow an oxidization speed of the dry oxidization process.

13. The method as claimed in claim 1, wherein the step of forming the oxide film is performed at a temperature of 700 to 1200° C. under an $O_2/H_2$ atmosphere.

14. The method as claimed in claim 1, wherein the oxide film is removed using HF or BOE.

15. A method of manufacturing a flash memory device, the method comprising:
    forming a first polysilicon layer over a semiconductor substrate to form a floating gate;
    patterning the first polysilicon layer;
    forming a dielectric layer over the semiconductor substrate including the first polysilicon layer;
    forming a second polysilicon layer and a silicide layer over the dielectric film to form a control gate, the silicide layer having silicon;
    oxidizing an upper portion of the silicide layer to move the silicon away from an interface between the second polysilicon layer and the silicide layer before an etch process of the tungsten silicide layer is performed to form a control gate; and
    completely removing an oxide film formed at the upper portion of the silicide layer as a result of the oxidizing step to expose a top surface of the silicide layer.

16. The method of claim 15, wherein the silicide is tungsten silicide.

17. The method of claim 15, wherein the silicide layer is formed by forming a first silicide film having a first silicon ratio and a second silicide film having a second silicon ratio over the first silicide film, the second silicon ratio being higher than the first silicon ratio.

18. A method of manufacturing a flash memory device, the method comprising:
    forming a first polysilicon layer over a semiconductor substrate to form a floating gate;
    forming a dielectric layer over the first polysilicon layer;
    forming a second polysilicon layer and a silicide layer over the dielectric film to form a control gate, the silicide layer having silicon;
    oxidizing an upper portion of the silicide layer to move the silicon away from an interface between the second polysilicon layer and the silicide layer before an etch process of the silicide layer is performed to form a control gate; and
    completely removing an oxide film formed at the upper portion of the silicide layer as a result of the oxidizing step to expose a top surface of the silicide layer.

19. The method of claim 18, wherein the silicide is tungsten silicide.

* * * * *